(12) United States Patent
Rey et al.

(10) Patent No.: US 12,347,705 B2
(45) Date of Patent: Jul. 1, 2025

(54) SOT DEFORM LEAD-RETRACT REMOVAL TRACK

(71) Applicant: Texas Instruments Incorporated, Dallas, TX (US)

(72) Inventors: Sunday Hirro Rey, Baguio (PH); Sonny Baskiñas Concepcion, Tuba Benguet (PH); Daniel Mendoza Ramirez, Jr., Baguio (PH); Christian dela Cruz Montemayor, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1519 days.

(21) Appl. No.: 16/269,441

(22) Filed: Feb. 6, 2019

(65) Prior Publication Data

US 2020/0251364 A1  Aug. 6, 2020

(51) Int. Cl.
| | |
|---|---|
| B65G 15/10 | (2006.01) |
| H01L 21/67 | (2006.01) |
| H01L 21/677 | (2006.01) |
| B07C 1/04 | (2006.01) |
| B07C 1/06 | (2006.01) |

(52) U.S. Cl.
CPC .. *H01L 21/67271* (2013.01); *H01L 21/67796* (2013.01); *B07C 1/04* (2013.01); *B07C 1/06* (2013.01)

(58) Field of Classification Search
CPC ......... H01L 21/67271; H01L 21/67796; B07C 1/06; B07C 1/04; H05K 13/02; B65G 15/10; B65G 15/46; B65G 27/04
See application file for complete search history.

(56) References Cited

U.S. PATENT DOCUMENTS

| | | | | | |
|---|---|---|---|---|---|
| 3,677,401 | A | * | 7/1972 | Chaparro | B65G 47/72 209/3.1 |
| 3,899,085 | A | * | 8/1975 | Chaparro | G01R 31/2851 198/345.3 |
| 4,314,628 | A | * | 2/1982 | Calbert | B65G 11/023 193/2 R |
| 4,651,090 | A | * | 3/1987 | Heigl | H01L 21/67271 324/537 |
| 4,686,637 | A | * | 8/1987 | Linker, Jr. | H05K 13/0092 382/146 |
| 5,702,028 | A | * | 12/1997 | Shirodera | A44B 19/42 209/615 |
| 6,450,320 | B1 | * | 9/2002 | Turek | B65G 47/1421 198/380 |
| 2015/0041282 | A1 | * | 2/2015 | Seitel | B65G 47/525 198/401 |

* cited by examiner

*Primary Examiner* — Patrick H Mackey
(74) *Attorney, Agent, or Firm* — Ronald O. Neerings; Frank D. Cimino

(57) ABSTRACT

A deform lead-retract removal track is provided which is configured to convey non-defective integrated circuit packages and remove integrated circuit packages having a lead-retract defect. The distance between the outside walls of the track is less than the distance between leads of the non-defective integrated circuit packages and greater than the distance between the leads of the integrated circuit packages having a lead-retract defect. The defective integrated circuit packages having a lead-retract defect are unable to enter the track or will become stuck on the track.

20 Claims, 8 Drawing Sheets

SOT DEFORM LEAD-RETRACT REMOVAL TRACK

BACKGROUND

A variety of semiconductor chip packages are provided with frame leads extending from the mold of the package. With the high-volume production of chip packages, any defective packages which jam or stick in a test handler may cause the purging of successive units. Over time, purging of a large number of chip packages due to defective packages can prove to be costly.

FIGS. 1A and 1B are perspective views of a defective chip package having a deformed lead. Deformed lead 111 represents one specific case of an engineering defect in a chip package. As shown, deformed lead 111 is one of the leads 112 which is deformed in a retracted position toward the body 109 of package (chip package) 110. This deformation is a defect which is known as a lead-retract defect. In an example, package 110 may represent a small outline transistor (SOT).

FIGS. 1C and 1D illustrate a perspective view and a front elevation view, respectively, of package 110 being jammed or stuck to contactor 120 of test handler 122 of testing assembly 124, due to a lead-retract defect. FIG. 1E illustrates a perspective drawing of chip bowl 130 having jammed packages 132. With reference to FIG. 1C, the jam may cause an automatic purging of successive package 115 and packages which are cued-up on track 135, of chip bowl 130 (as shown in of FIG. 1E) for testing. In some cases, the jamming of one package may result in the purging of approximately 25 packages in error.

A need exists for a tool and method to solve the foregoing problem of a deformed or lead-retract defect, which may cause a package to be stuck to a test handler and which may result in the purging of successive packages in error.

SUMMARY

A lead-retract defect removal track is configured to remove integrated circuit packages, having a lead-retract defect, from a testing assembly. In an example, the track has a uniform cross section along its length. The uniform cross section has a base portion and two lead guides extending away from the base portion at the ends of the width of the base. The outside walls of lead guides are configured to prevent the integrated circuit packages, having a lead-retract defect, from moving across the length of the track.

BRIEF DESCRIPTION OF THE DRAWINGS

For a more complete understanding of the present disclosure, the objects and advantages thereof, reference is now made to the ensuing descriptions taken in connection with the accompanying drawings briefly described as follows.

Reference will now be made to the accompanying drawings, which are not necessarily drawn to scale, wherein.

DETAILED DESCRIPTION

Figure 1A:
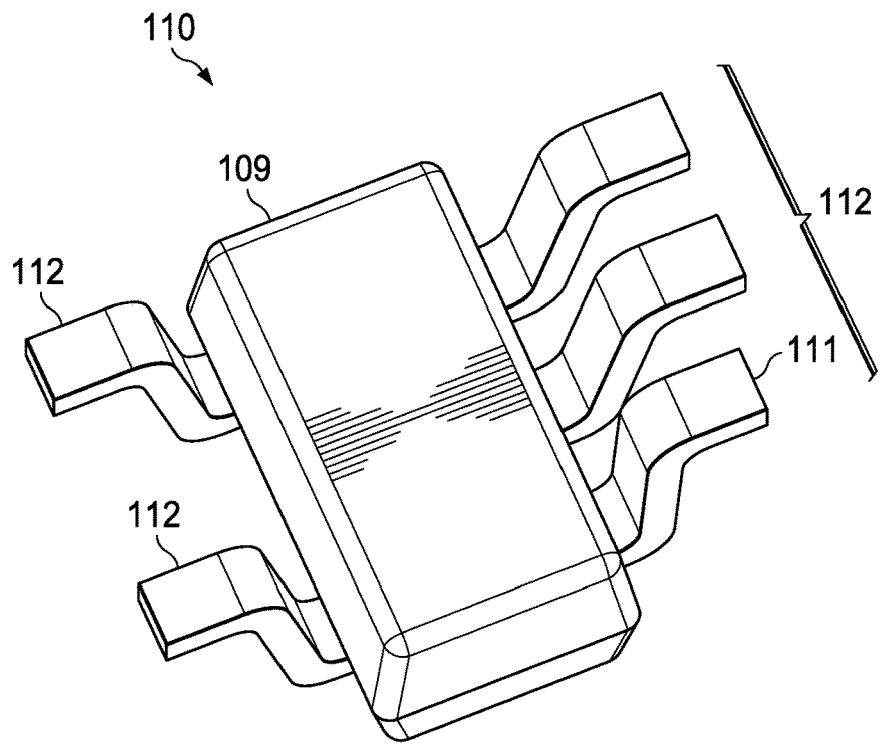
FIG. 1A is a perspective view of a defective chip package having a deformed lead.
Figure 1B:
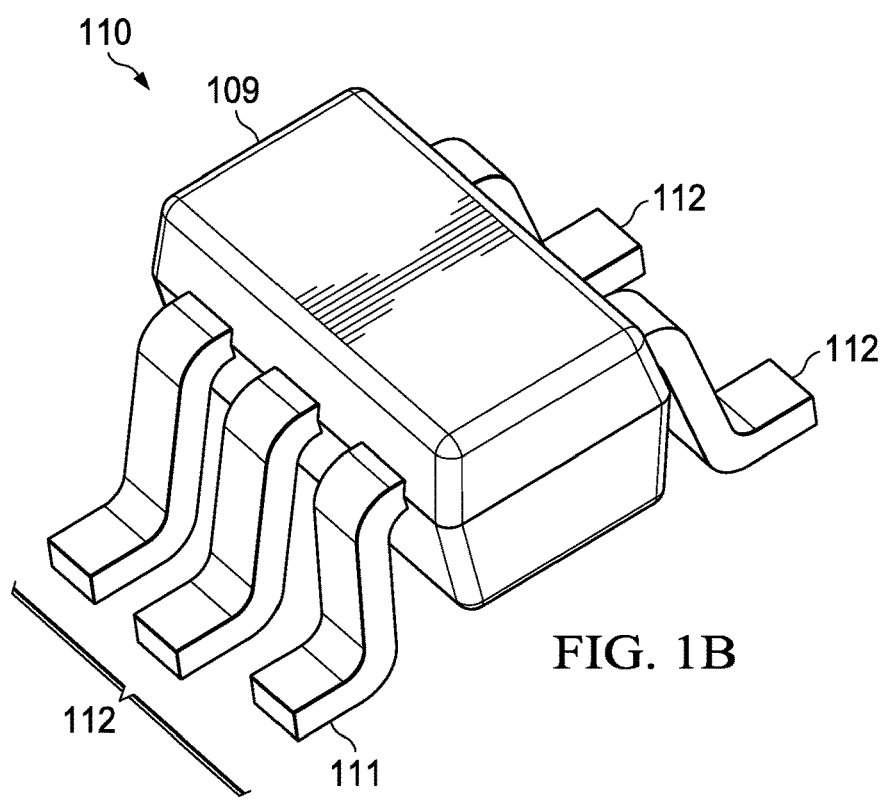
FIG. 1B is a perspective view of a defective chip package having a deformed lead.
Figure 1C:
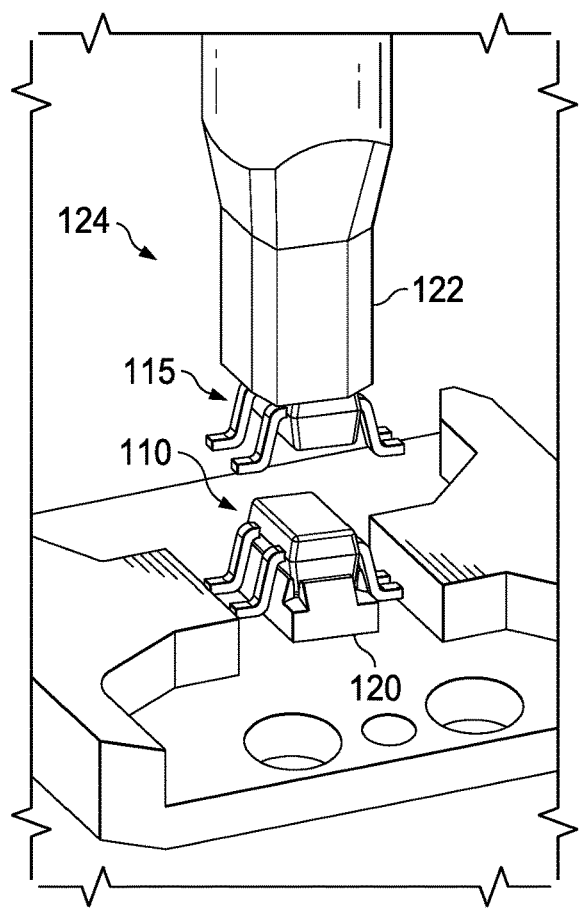
FIG. 1C illustrates a perspective view of a defective chip package which has stuck to the contactor of a test handler.
Figure 1D:
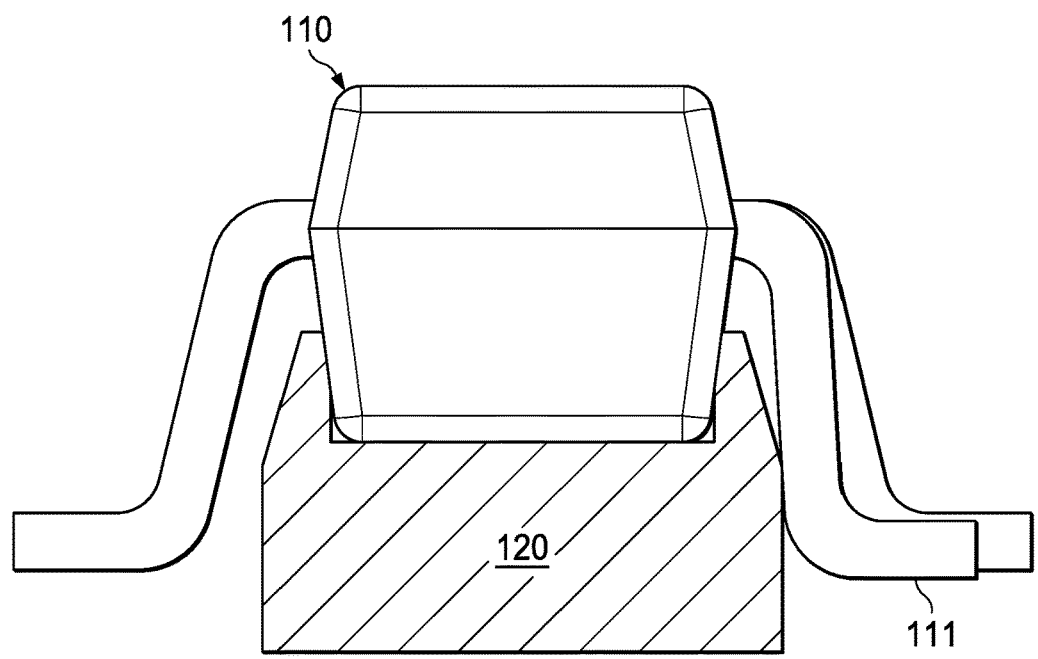
FIG. 1D is a front elevation view of a defective chip package which has stuck to a contactor.

Examples are described with reference to the drawings, wherein like reference numerals are used to designate similar or equivalent elements. Illustrated ordering of acts or events should not be considered as limiting, as some acts or events may occur in different order and/or concurrently with other acts or events. Further, some illustrated acts or events not be required to implement a methodology in accordance with this disclosure.

Figure 1E:
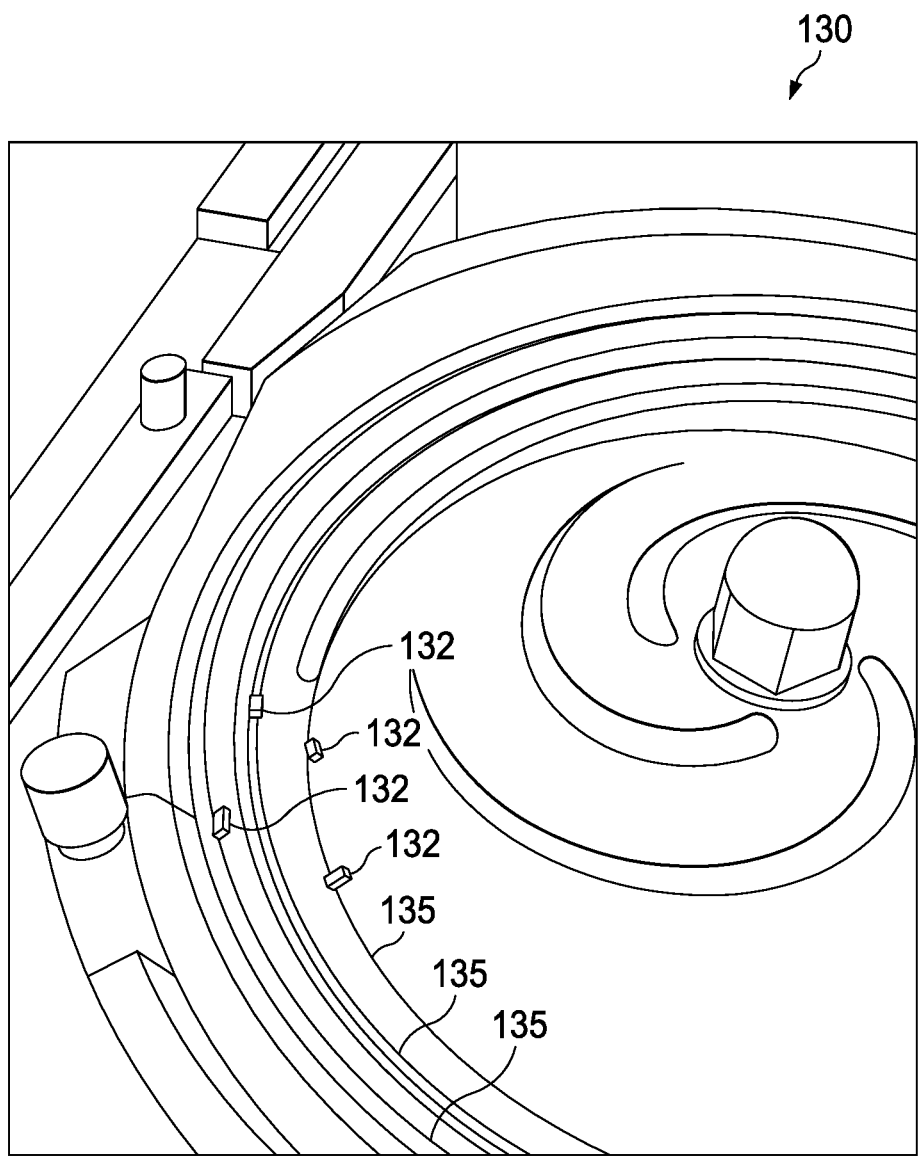
FIG. 1E is a top view of a chip bowl, according to an example.
Figure 2A:
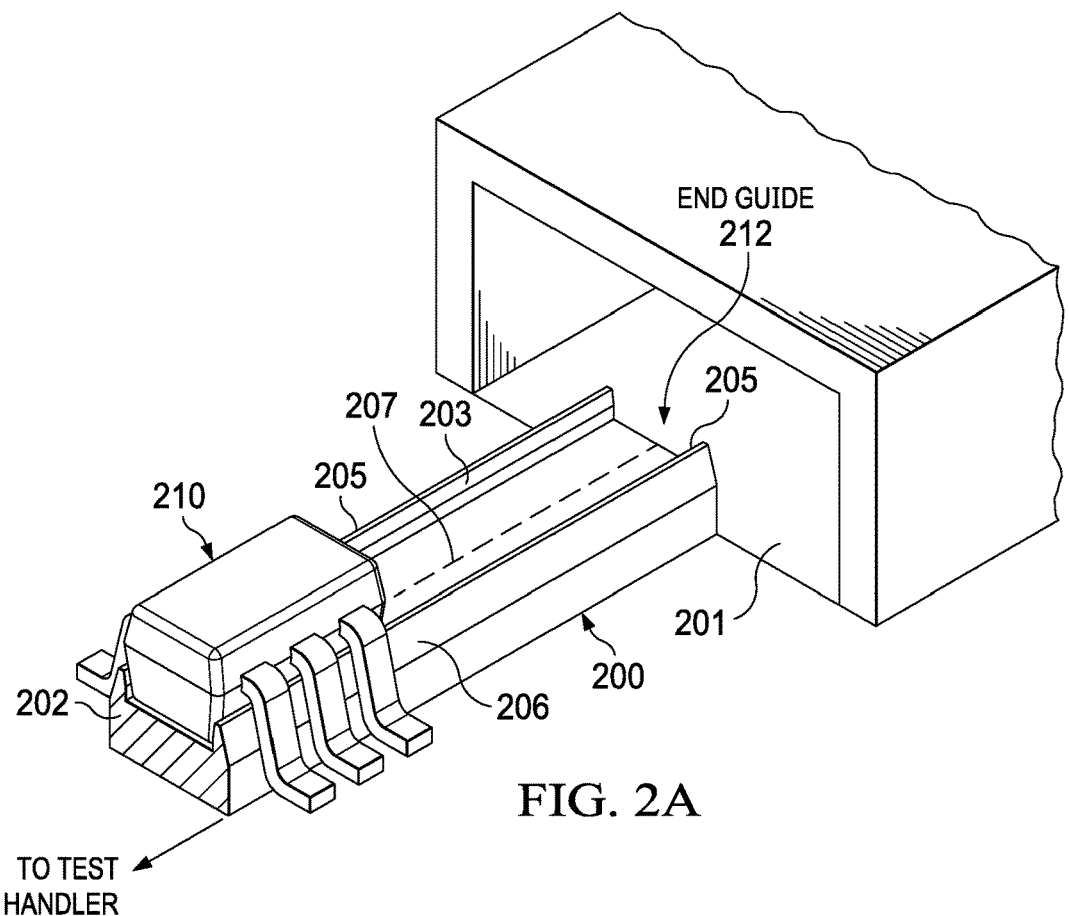
FIG. 2A illustrates a perspective view of the deform lead-retract removal track providing a path for a chip package, according to an example.
Figure 2B:
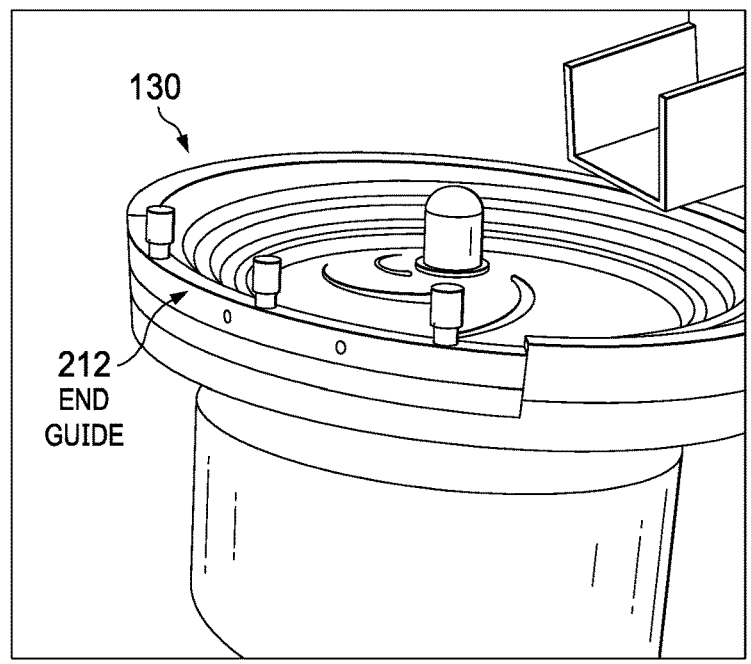
FIG. 2B is a perspective of a chip bowl, according to an example.
Figure 2C:
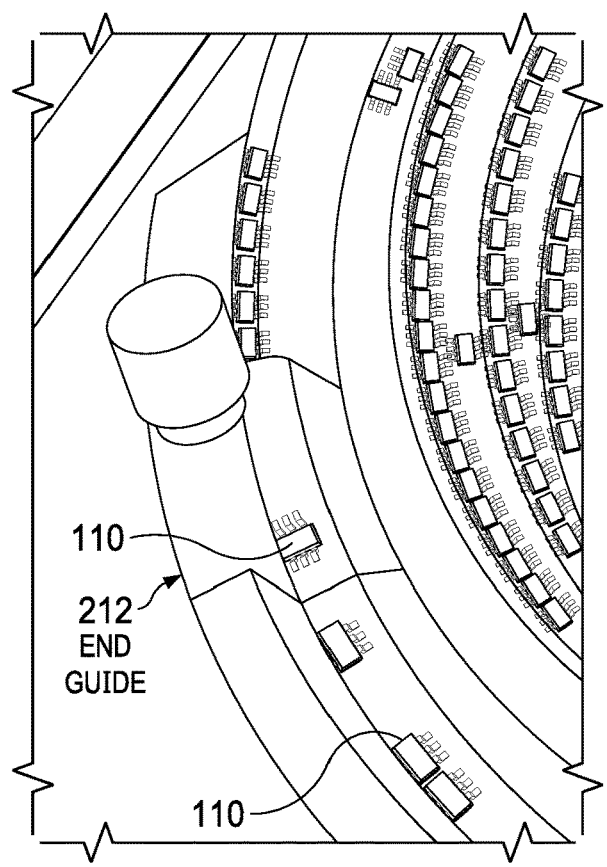
FIG. 2C is a perspective view of a chip bowl, according to an example.

FIG. 2A illustrates a perspective view of lead-retract defect removal track 200 (track 200). FIGS. 2B and 2C illustrate a perspective view of chip bowl 130. Track 200 provides a path for package (chip package) 210 from exit 201, which may be the exit, for example, of a chip bowl (shown in FIGS. 1E and 2B) to a test handler (122 in FIG. 1C). With reference to FIGS. 1C, 2A, 2B, 2C, in an example, the lead-retract defect removal track 200 is positioned after the end guide 212 of chip bowl 130 and ahead of the entry of package 210 into a test handler (122 in FIG. 1C). Package 210 with non-defective leads will move along track 200 and proceed to the test handler 122 of FIG. 1C). Packages with retracted leads will jam on track 200, preventing package 210 from continuing to test handler 122. This also prevents a situation where a lead-retract defect may cause purging of successive units.

With reference to FIG. 2A, in an example, track 200 is further comprised of base 202 having a lead guide 205, on each side of base 202, extending from base 202 along the length of track 200. In an example, each lead guide 205 includes an outer wall 206 (only one outer wall is visible in FIG. 2A) which is angled inward towards center axis 207 along the length of track 200. Lead guides 205 are configured such that the distance between each inner wall 203 (only one inner wall 203 is visible in FIG. 2A) is enough to allow package 210 to be positioned between each lead guide 205.

Figure 3:
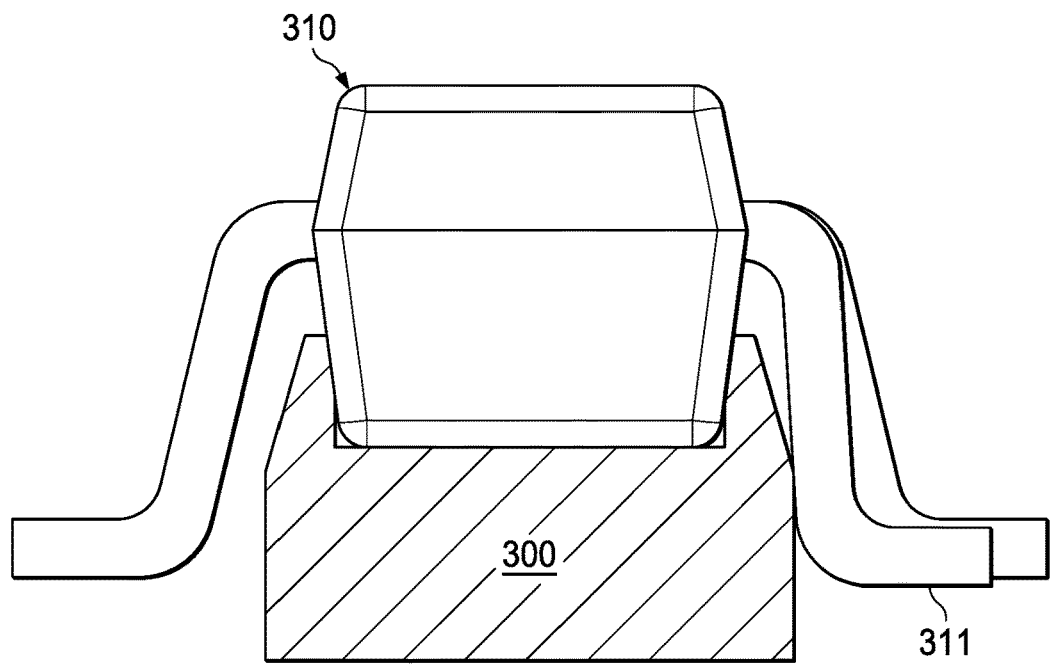
FIG. 3 illustrates a front elevation view of a defective chip package having a retracted lead jammed on the deform lead-retract removal track, according to an example.

FIG. 3 illustrates a front elevation view of the deform lead-retract removal track 300 designed to cause a chip package 310, having a retracted lead 311, to jam/lodge on the track 300. In an example, chip package 310, which is defective and jammed on track 300, will be removed. Therefore, package 310 will be unable to proceed to the test handler, where its retracted lead 311 would otherwise jam on the contactor 120 of the handler 122 in FIG. 1C causing purging of successive packages.

Figure 4A:
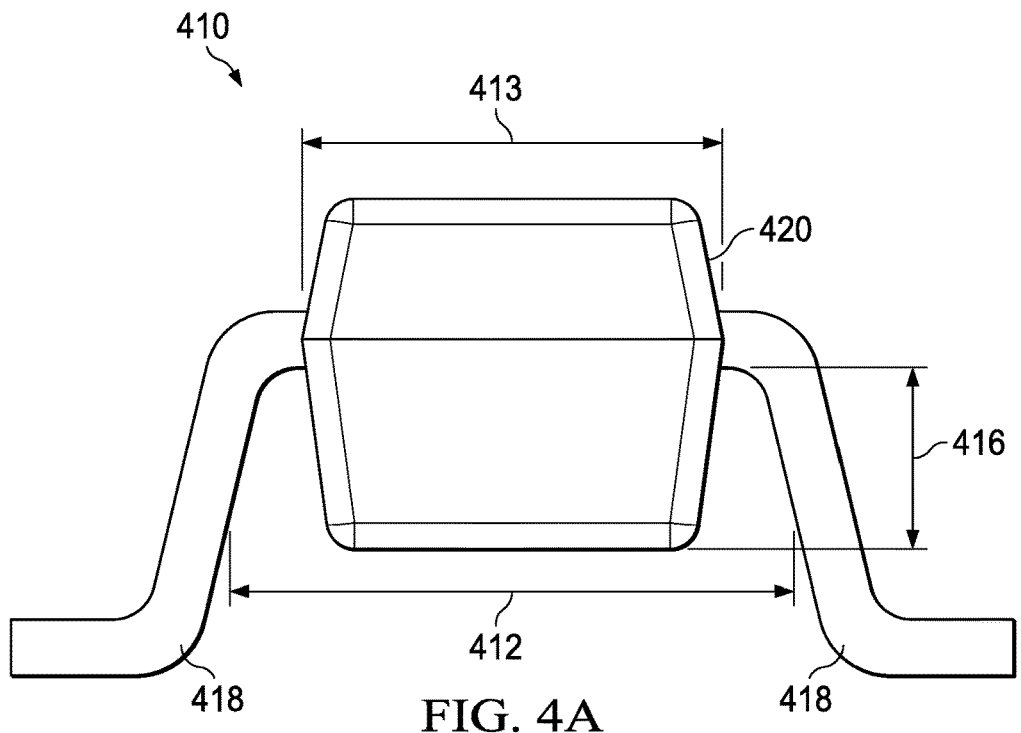
FIG. 4A is a front elevation view of a non-defective chip package, according to an example.
Figure 4B:
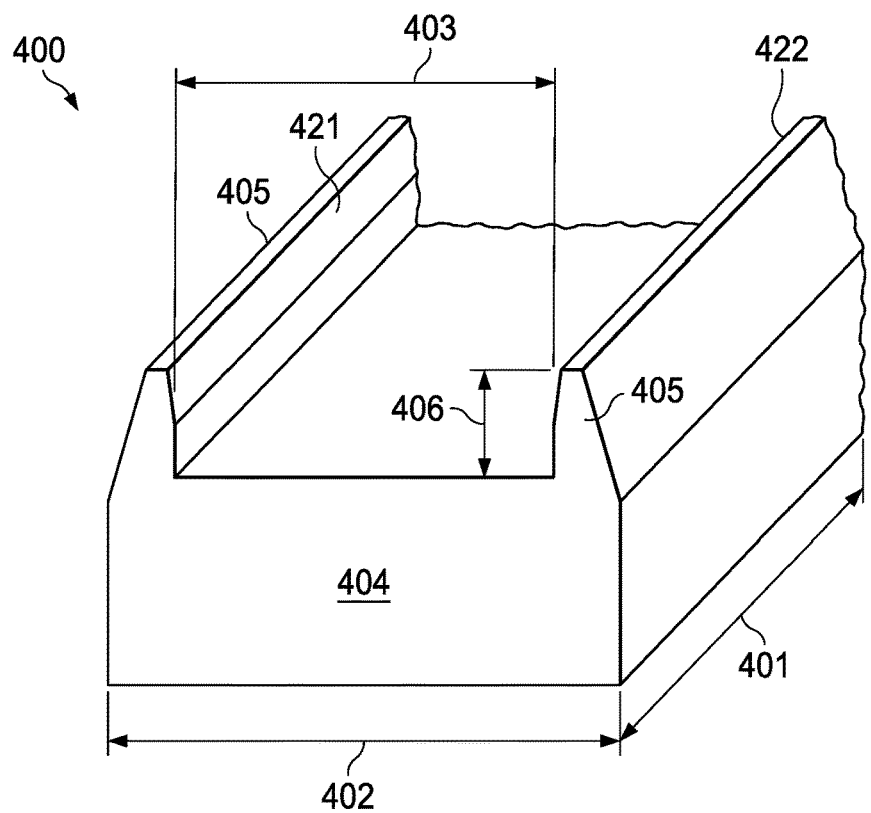
FIG. 4B is perspective view of the lead-retract defect removal track, according to an example.

FIG. 4A is a front elevation view of a non-defective chip package 410, according to an example. FIG. 4B shows a perspective view of the lead-retract defect removal track corresponding to FIG. 4A. With reference to FIG. 4B, track 400 is comprised of a base 404 having a rectangular cross section. Base 404 of track 400 may be comprised of a trapezoidal cross section. In some examples, the cross section is an isosceles trapezoid. Track 400 further comprises lead guide 405, one of which is provided on each side and along the length 401 of track 400. As shown in FIG. 4B, each lead guide 405 extends from the base 404 at the same height 406. Each lead guide 405 is configured such that the distance between outer wall 402 of the guides fit within the distance 412 between two leads (each lead being represented by reference number 418), which are not defective, of package 410. With reference to FIG. 4A, each lead guide is further configured to permit the width of the mold 413 of a non-defective package 410 to fit within the distance 403 between the inner walls 421 and 422 of track 400. In an example, distance 403 between the inner walls 421 and 422 can be considered to form a slot. In an example, lead guides 405 outline a substantially triangular or trapezoidal cross section along the length of track 400.

In an example, the distance between the inner walls 421 and 422 of two respective lead guides 405 is 0.03 millimeters (mm) greater than the width of mold 420 of package 410, when mold 420 is at a maximum material condition. In an example, the distance between the outer walls of the lead guides 402 is 0.02 mm less than the distance 412 between the leads 418 on either side of package 410. In an example, the height 406 of each lead guides 405, as measured from base 404, is 0.11 mm less than the height dimension 416 shown for each lead 418 of package 410. This configuration allows for non-defective packages to pass along the track 400. However, packages with a lead-retract defect, severe enough to cause jamming at the handler, will become stuck at track 400 such that they do not move on to the test handler (not shown).

In an example, a package has a mold with a width of approximately 1.55 mm at LMC (least material condition) and 1.65 mm at MMC (maximum material condition). An example package has leads having a height of approximately 0.6 mm, a width of about 1.82 mm between the inner walls of the leads, and a width of 2.82 to 2.93 mm from the ends of the leads. An exemplary configured track, to screen out said example packages with a lead-retract defect, has a base having a rectangular cross section with a width of approximately 1.80 mm. The lead guides have a substantially trapezoidal cross section having a width of about 0.06 mm and a height of about 0.5 mm. The base of the trapezoidal cross section of the lead guides is positioned such that the outside corner is coincident with the upper corner of the rectangular cross section of the base of the track. Therefore, the example track has a width of at least 1.68 mm between the lead guides to allow for the width of the mold of a non-defective package. The example track also has a width of 1.80 mm between the outer walls of the end guides, such that the end guides will fit between the leads of a non-defective package. Therefore, any lead-retract defect of an example package which creates a distance less than 1.80 mm between the leads (the lead-retract defect leading to an error 0.02 mm greater than tolerance) would get stuck in the removal track and not proceed to the test handler. In an example, the deform lead-retract removal track is 5 mm in length.

Due to variances and tolerancing in the manufacturing processes, it should be noted that the dimensions of the example deform lead-retract removal tracks and the dimensions of the example integrated circuit packages are approximate and may carry some slight variances. Furthermore, example integrated circuit packages may be provided with a different number of leads than considered in the examples presented herein. Additionally, the track may be implemented in the fabrication process of any integrated circuit packages having leads which are vulnerable to a lead-retract defect.

In an example, an operator is alerted to the absence of packages beyond the removal track, and the operator removes the defective packages. The alert may be triggered by the absence of contact sensed by the handler, by not sensing the weight of the package, or by not sensing conduction from the package. In an example, the removal track conveys non-defective packages to a linear track. If no packages are sensed or visible on the linear track, an operator will look to remove defective packages from the removal track.

Figure 5A:
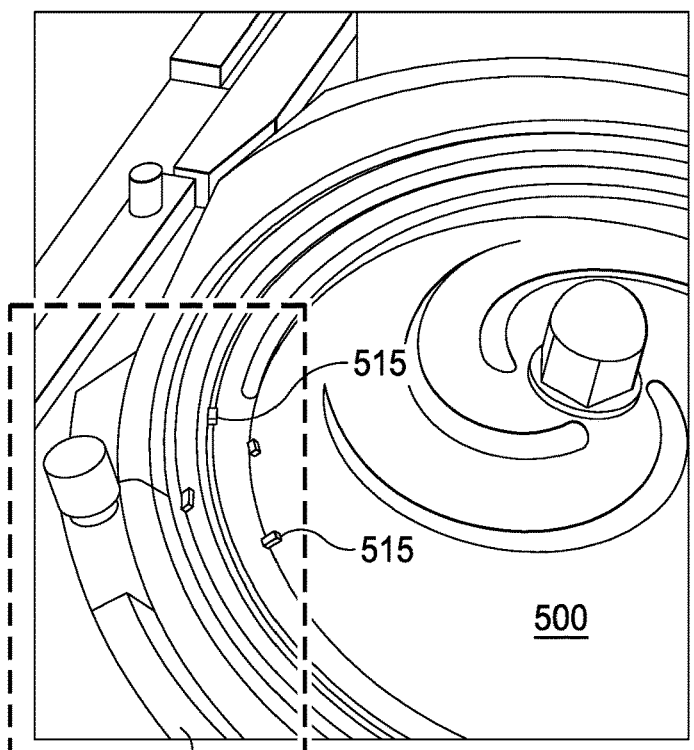
FIG. 5A is a perspective view of a chip bowl wherein the lead-retract defect removal track is to be incorporated, according to an example.
Figure 5B:
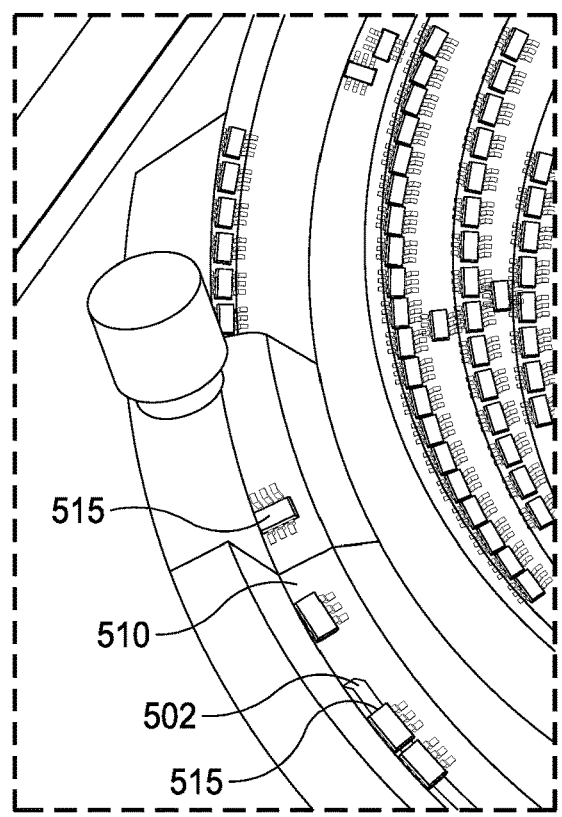
FIG. 5B is a perspective view of a chip bowl where the lead-retract defect removal track is to be incorporated, according to an example.

In an example, FIGS. 5A and 5B illustrate a perspective view of a chip bowl 500 having lead-retract defect removal track 502, which is incorporated at end guide 510 of chip bowl 500. In the illustrated example, chip bowl 500 rotates to push small outline packages 515, which may represent small outline transistor packages, towards the perimeter of bowl 500 and into end guide 510. In an example, lead-retract removal track 502 is incorporated at end guide 510 such that a package 515, having a retracted lead defect, cannot enter end guide 510 and remain in chip bowl 500. In an example, an operator (whether live or robotic) will remove defective packages (packages with defective leads) which remain in chip bowl 500. In some examples, handler 122 of FIG. 1C may be adapted to remove defective chips from track 502.

Figures 6A, 6B, 6C:
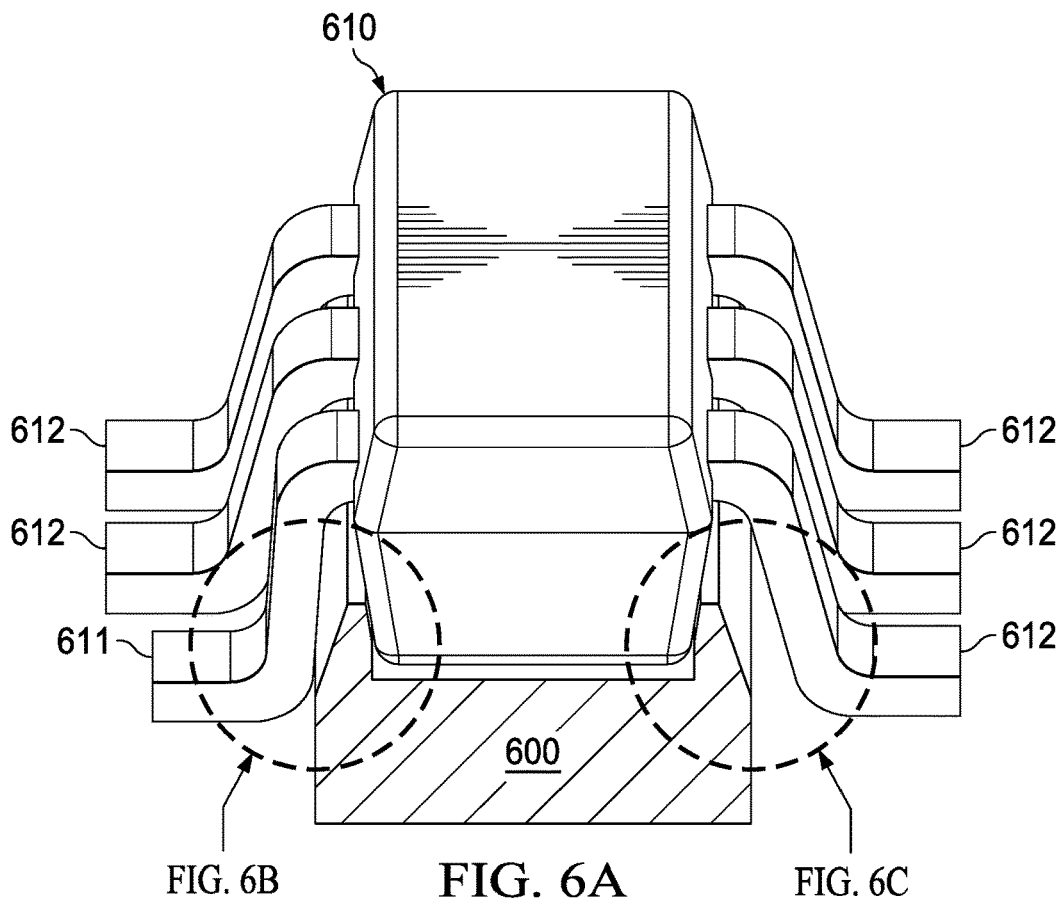
FIG. 6A is a perspective view of a defective chip package having a retracted lead jamming on the lead-retract defect removal track, according to an example.
FIG. 6B is a perspective view of a defective chip package having a retracted lead jamming on the lead-retract defect removal track, according to an example.
FIG. 6C is a perspective view of the lead-retract defect removal track providing a path for a chip package, according to an example.
Figures 6B, 6C:
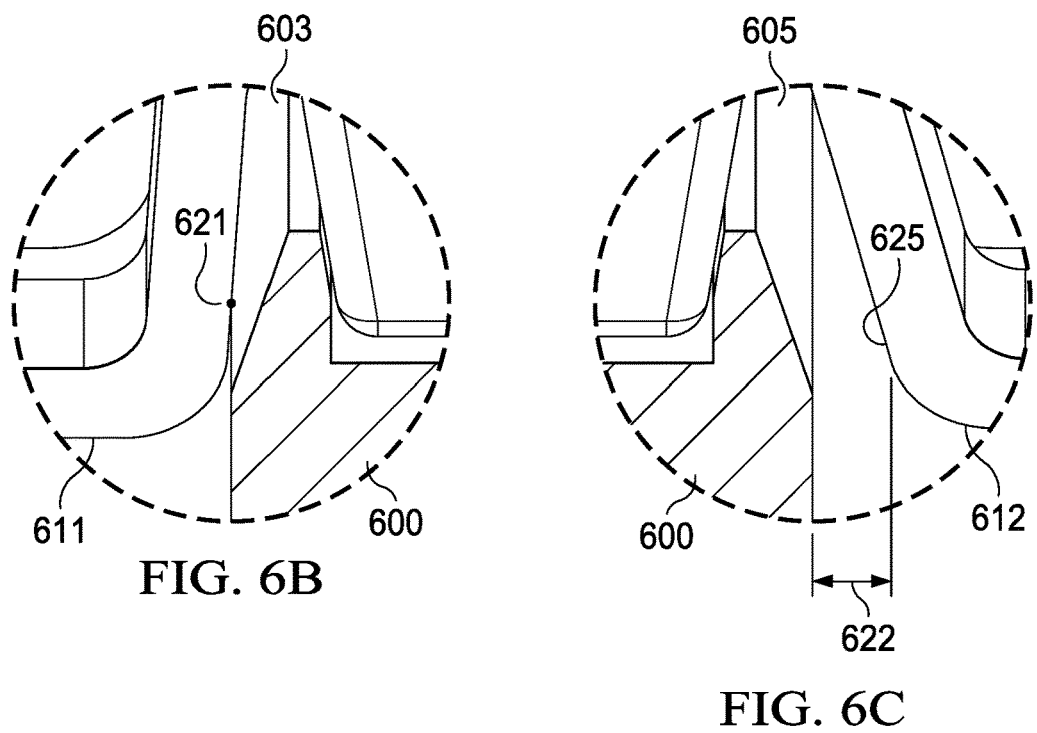

FIGS. 6A, 6B and 6C illustrate perspective views showing various aspects of chip package 610 having a retracted lead jamming on lead-retract defect removal track 600. In an example, with reference to FIGS. 6A-6C, chip package 610 is provided having one or more leads. In an example, a chip package 610 is depicted to have six leads. In the example, the chip package is depicted to have five non-defective leads (each lead labeled 612), and one lead having a retract defect, lead 611. In an example, track 600 has a uniform cross section along a length.

In an example, with reference to FIG. 6B the cross section of the track 600 has two outer walls (labeled 603 and 605 respectively) which are dimensioned to interfere with any chip packages having a lead-retract defect 611. In an example, the interference creates a point of contact 621 between lead 611, having a retract defect, and an outer wall (603 or 605) of track 600.

In an example, with reference to FIG. 6C, the cross section of the deform lead-retract removal track 600 is dimensioned such that a chip package comprising only non-defective leads 612 will pass across the length of track 600 without jamming A distance 622 is provided between the outer walls (603 and 605) of track 600 and the inner edge 625 of each non-defective leads 612.

In an example, FIGS. 6A and 6B depict the deform lead-retract removal track 600 provided to cause a chip package 610 having a retracted lead 611 to jam. Chip packages with all leads properly aligned will proceed to the test handler. However, chip package 610 with defective leads that are jammed on removal track 600 will be removed. Therefore, the deformed package 610 will be unable to proceed to the test handler, where the retracted lead 611 may jam on the contactor of the handler causing purging of successive packages The foregoing has been described herein using specific examples for the purposes of illustration only. It will be readily apparent to one of ordinary skill in the art, however, that the principles of the disclosure can be embodied in other ways. Therefore, the foregoing should not be regarded as being limited in scope to the specific examples disclosed herein, but instead as being fully commensurate in scope with the following claims.

We claim:

1. A track configured to remove integrated circuit packages having a lead-retract defect, the track having a length and a uniform cross section provided along the length, the uniform cross section comprising:
   a base having a first end and a second end separated by a width;
   a first lead guide extending away from the base at the first end, the first lead guide having an outside wall and having an inside wall; and
   a second lead guide extending away from the base at the second end, the second lead guide having an outside wall and an inside wall, wherein the outside walls of the first and second lead guides prevent the integrated circuit packages having a lead-retract defect from moving across the length of the track.

2. The track configured to remove integrated circuit packages as recited in claim 1, wherein the integrated circuit package is a small outline transistor package.

3. The track of claim 1, wherein the outside wall of the first lead guide coincides with the first end of the base at least at one point, wherein the outside wall of the second lead guide coincides with the second end of the base at least at one point.

4. The track of claim 3, wherein a distance between the inside walls of the first and second lead guides is greater than a width of a mold of an integrated circuit package.

5. A track configured to remove integrated circuit packages having a lead-retract defect, the track having a length and a uniform cross section provided along the length, the uniform cross section comprising:
   a base having a first end and a second end separated by a width,
   a first lead guide extending away from the base at the first end, the first lead guide having an outside wall and having an inside wall; and
   a second lead guide extending away from the base at the second end, the second lead guide having an outside wall and an inside wall, wherein the outside walls of the first and second lead guides prevent the integrated circuit packages having a lead-retract defect from moving across the length of the track, and wherein the outside walls of the first and second lead guides are angled inward.

6. The track of claim 5, wherein the base is comprised of a rectangle extruded across the length of the uniform cross section.

7. A track configured to convey non-defective integrated circuit packages and remove integrated circuit packages having a lead-retract defect, comprising:
   the track having a length and a uniform cross section provided along the length;
   the uniform cross section formed by an extruded isosceles trapezoid having a small base and a large base, separated by a height, and two legs of equal length, the two legs forming outside walls of the track;
   the uniform cross section further formed by an extruded rectangular cut having a length equal to the length of the track, a width less than the width of the small base, and a height less than the height of the extruded isosceles trapezoid, wherein the extruded cut extends from the small base of the extruded isosceles trapezoid towards the large base to form a slot along the length of the track, and wherein a distance between the outside walls of the track is less than the distance between leads of the non-defective integrated circuit packages and greater than the distance between the leads of the integrated circuit packages having a lead-retract defect.

8. The track of claim 7, wherein the width of the extruded rectangular cut is greater than a width of molds of the non-defective integrated circuit packages.

9. The track of claim 7, wherein the height of the extruded rectangular cut is less than a height of the leads of the non-defective integrated circuit packages.

10. The track as recited in claim 7, wherein the integrated circuit packages are small outline transistor packages.

11. A method for screening integrated circuit packages having a lead-retract defect, the method comprising the steps of:
   providing a plurality of integrated circuit packages in a chip bowl;
   moving the plurality of integrated circuit packages toward an end guide of the chip bowl;
   conveying the plurality of integrated circuit packages on to a lead-retract removal track; and
   removing the integrated circuit packages having a lead-retract defect from the lead-retract removal track and the chip bowl,
   wherein the lead-retract removal track has a length and a uniform cross section provided along the length, wherein the lead-retract removal track is configured to convey non-defective integrated circuit packages, and wherein the integrated circuit packages having a lead-retract defect are unable to convey across the length of the lead-retract removal track.

12. The method of claim 11, further comprising the step of conveying the non-defective integrated circuit packages to a linear track.

13. The method of claim 11, further comprising the step of alerting an operator when non-defective integrated circuit packages are not present on the linear track.

14. The method as recited in claim 11 wherein the integrated circuit packages are small outline transistor packages.

15. A integrated circuit package bowl feeding system being capable of removing chip packages having a lead-retract defect, comprising:
   a chip bowl; and
   a track coupled to the chip bowl, the track having a cross-section spanning the distance between properly aligned leads on either side of a chip package.

16. The integrated circuit package bowl feeding system as recited in claim 15 wherein the track has a cross-section spanning the distance between properly aligned leads on either side of the chip package.

17. The integrated circuit package bowl feeding system as recited in claim 15 where in the track has a base with a cross-section spanning at least 1.88 millimeters.

18. The integrated circuit package bowl feeding system as recited in claim 15 wherein the chip package is a small outline transistor package.

19. The integrated circuit package bowl feeding system as recited in claim 15 wherein chip packages having a lead-retract defect will get stuck on the track.

20. The integrated circuit package bowl feeding system as recited in claim 15 wherein the track prevents integrated circuit packages having a lead-retract defect from moving across the length of the track.

* * * * *